United States Patent [19]

Bachmann et al.

[11] Patent Number: 4,892,431
[45] Date of Patent: Jan. 9, 1990

[54] MOUNTING DEVICE FOR CONDUCTOR PLATES

[75] Inventors: Peter Bachmann, Karlsruhe; Hans U. Guenther, Straubenhardt, both of Fed. Rep. of Germany

[73] Assignee: Schroff GmbH, Straubenhardt, Fed. Rep. of Germany

[21] Appl. No.: 149,328

[22] Filed: Jan. 28, 1988

[30] Foreign Application Priority Data

Feb. 5, 1987 [DE] Fed. Rep. of Germany ....... 8701710

[51] Int. Cl.⁴ .......................... F16B 9/00; H05K 7/00; H05K 5/00
[52] U.S. Cl. ...................... 403/187; 403/24; 403/189; 403/403; 403/406.1; 403/409.1; 361/392; 361/397; 361/399; 24/297; 24/458
[58] Field of Search ................ 403/403, 245, 24, 189, 403/282, 252, 242, 405.1, 406.1, 409.1, 187; 361/397, 399, 392; 211/41; 174/138 G; 439/630; 24/297, 453, 458

[56] References Cited

U.S. PATENT DOCUMENTS

| | | | |
|---|---|---|---|
| 3,567,998 | 3/1971 | Ammerman | 361/399 |
| 4,193,108 | 3/1980 | Romano | 361/399 |
| 4,589,794 | 5/1986 | Sugiura | 403/405.1 X |
| 4,783,720 | 11/1988 | Joist | 361/399 |
| 4,833,848 | 5/1989 | Guerin | 403/295 X |

FOREIGN PATENT DOCUMENTS

1018565 1/1966 United Kingdom ................ 24/297

OTHER PUBLICATIONS

Meyers Lexikon der Technik und der Exakten Naturwissenschaften, Bibliographisches Institut, Mannheim, Wien, Zurich.

Brockhaus, Naturwissenschaften und Technik, F. A. Brockhaus, Wiesbaden.

*Primary Examiner*—Randolph A. Reese
*Assistant Examiner*—Franco Deliguori
*Attorney, Agent, or Firm*—Spencer & Frank

[57] ABSTRACT

A connecting plug for providing lateral support for a circuit board in a plug-in unit intended to receive electrical and electronic components in industrial electronic devices, wherein the plug-in unit includes a front panel and circuit board fastened to the rear of the front panel and perpendicularly thereto by means of at least two holding blocks. The connecting plug includes a body provided on one side with at least one insertion groove for receiving a circuit board. A plug-in pin projects from the opposite side of the body and is shaped to provide a press seat with a blind recess provided in a rear face of a front panel of a plug-in unit to prevent the connecting plug from dropping off such front panel.

12 Claims, 3 Drawing Sheets

MOUNTING DEVICE FOR CONDUCTOR PLATES

BACKGROUND OF THE INVENTION

The innovation relates to a holding device for circuit boards in plug-in units intended to receive electrical and electronic components in industrial electronic devices and including a front panel, with the circuit board being fastened to the rear of the front panel and perpendicularly thereto by means of at least two holding blocks.

The innovation is employed, in particular, in such plug-in units which are equipped with circuit boards; having larger dimensions and consequently also having larger front panels.

The firm, mechanical connection of a front panel with a circuit board with the aid of holding blocks is called a plug-in unit. Such a unit offers the advantage that the components of the circuit board can be firmly connected with operating and display elements on the face of the unit and the space requirement in the component carrier is fixed.

To fasten the circuit board to the front panel, a plug-in unit requires at least two fastening points. These fastening points lie at the corners of the circuit board and at the ends of the front panel; holding blocks provided with threaded holes serve as the fastening points in which engage fastening screws. To establish a connection, the front panel is screwed to the holding blocks from one side and the circuit board at a right angle thereto. The forces required to pull out the circuit board—in view of the multiple-prong connections employed, these may amount to up to 10 kiloponds—are transferred without difficulty by way of these double screw connections. Customarily, the fastening screws penetrating the front panel are hidden in or behind gripping strips and are therefore invisible.

It has now been found that the connection of circuit boards and front panels at two fastening points is not sufficient for circuit boards having large dimensions. High circuit boards additionally require lateral guidance between the fastening points and, moreover, the front panel requires a center support during insertion. To be able to control these transverse and pressure forces, it is known to provide one or two additional holding blocks between the two fastening points in the corners. However, this is a considerable disadvantage because in this central region of the front panel, it must be possible to install operating elements, measuring instruments or the like and additionally screw holes would be visible in a highly undesirable manner.

SUMMARY OF THE INVENTION

The object of the innovation is the development of a technical measure which makes it possible to create additional connections in the region between the corner connection points between circuit board and front panel of a plug-in unit; these additional connections, which can be arranged at any desired location and which are invisible on the frontal face, are suitable to transfer the forces occurring there.

To solve this problem, a holding device for circuit boards in plug-in units is used as the basis; such device is intended to receive electrical and electronic components in industrial electronic devices and includes a front panel, with the circuit board being fastened to the rear of the front panel and perpendicularly thereto by means of at least two holding blocks.

The problem in question is solved by a connecting plug which includes at least one insertion groove for the circuit board and one plug-in pin and by a recess provided in the rear of the front panel into which fits the plug-in pin. This plug-in pin is able to transfer transverse forces as well as pressure forces between circuit board and front panel. Its arrangement is invisible from the front of the front panel and a plurality of such connecting plugs can be arranged at any desired locations between the two corner connection points. The insertion groove serves to receive the front edge of the circuit board and the plug-in pin serves to establish a connection with the front panel. The fit is selected such that a press seat is realized which prevents the connecting plug from dropping off.

Advisably, the insertion groove of the connecting plug is formed by two parallel, juxtaposed flanges. These flanges lie against both sides of the circuit board.

Advantageously, a spring arm will be provided on either side of one of the flanges. These spring arms ensure that the circuit board is held in the connecting plug without play.

Advisably, the spring arms are formed onto the flanges.

To facilitate insertion of the circuit board into the connecting plug, insertion slopes are provided at the free ends of the flanges and the upper edges of the spring arms are provided with corresponding slopes The plug-in pin of the connecting plug may have a circularly cylindrical shape; in this case, a blind bore of corresponding diameter serves as the recess in the front panel.

Advantageously, an annular groove is provided at the base of the plug-in pin; this has the advantage that it is not necessary to debur the blind bore at the rear of the front panel.

In a second embodiment, the plug-in pin of the connecting plug may also have a prism shape and the front panel has a rectangular groove as the recess. This configuration has the advantage that the connecting plug can be displaced in the direction toward the one or the other fastening point even after installation.

The connecting plug itself is advisably made of a suitable, spring-elastic plastic.

BRIEF DESCRIPTION OF THE DRAWINGS

The innovation will be described in greater detail below for one embodiment thereof and with reference to the attached drawing figures. The drawing figures show in.

DESCRIPTION OF THE PREFERRED EMBODIMENT

Figure 1:
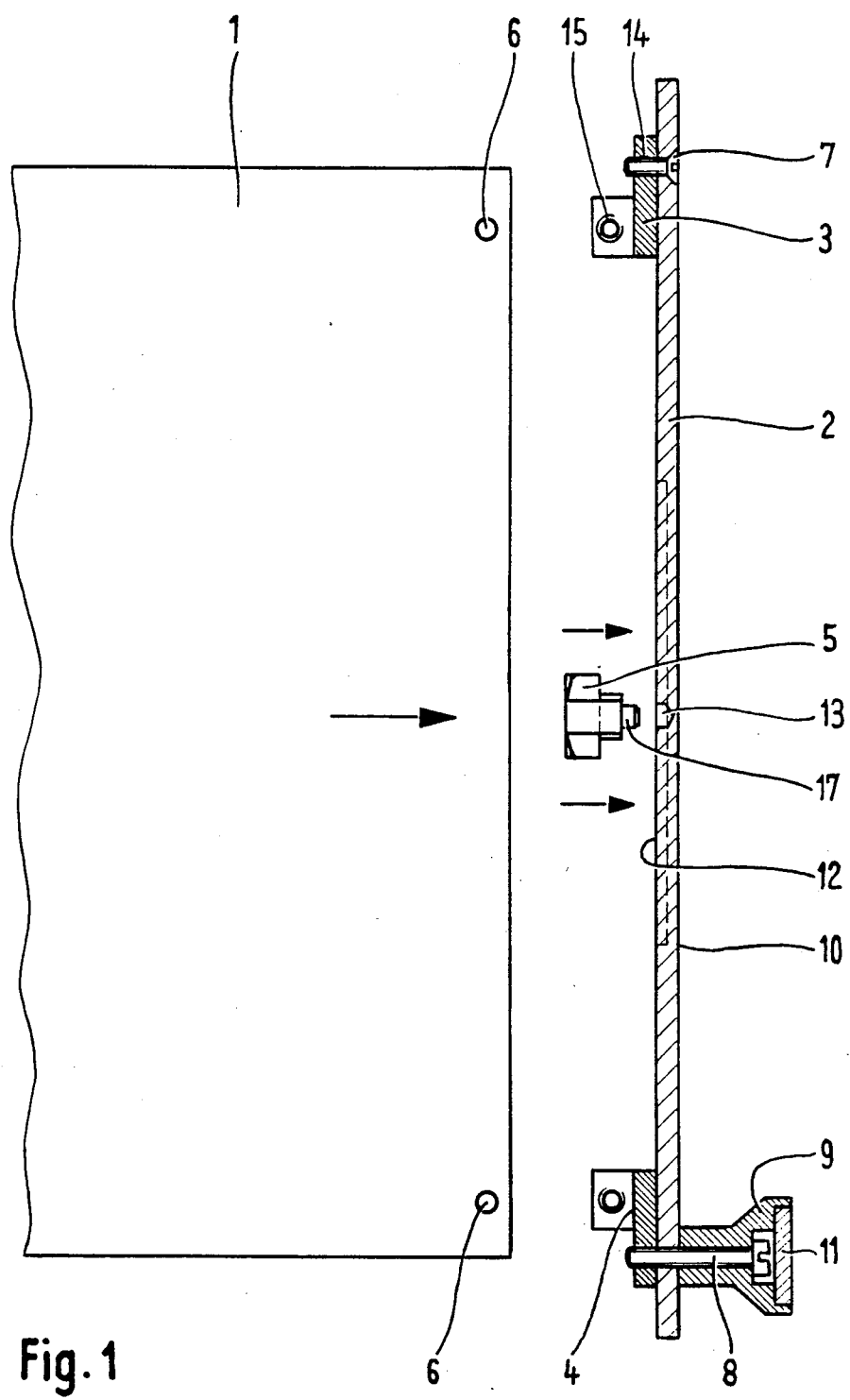
FIG. 1, a side view, in actual size, of a plug-in unit composed of a circuit board and an associated front panel, two holding blocks and a connecting plug in a pulled-apart position.
Figure 2:
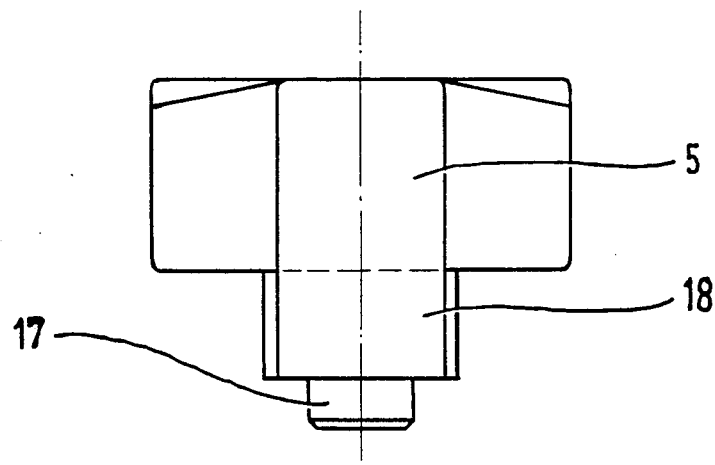
FIG. 2, a side view of the connecting plug according to FIG. 1, to an approximately 5-times enlarged scale.

The plug-in unit shown in FIG. 1 is essentially composed of a circuit board 1, a front panel 2, two holding blocks 3 and 4 and a connecting plug 5.

The circuit board 1, shown cut away, is composed of a suitable insulating material, carries conductive paths and is intended to receive electrical and/or electronic components; at each one of its two front corners it is provided with a fastening hole 6.

The front panel 2, composed of metal, preferably of aluminum and shown in section in FIG. 1, has an elongated rectangular cross section and near its ends it supports the two holding blocks 3 and 4. The upper holding block 3 is screwed to front panel 2 by means of a flat head screw 7; the lower holding block 4 is screwed on by means of a cylinder head screw 8 which is seated in a gripping strip 9 projecting from the frontal face 10 of front panel 2. A cover strip 11 inserted in the frontal face of gripping strip 9 conceals the head of cylinder head screw 8. A recess 13 in the form of a blind bore is provided in the center of the rear face 12 of front panel 2.

Holding blocks 3 and 4 have the shape of the letter L and are manufactured, for example, of die-cast zinc; they are provided with two mutually perpendicular threaded holes 14 and 15. Flat head screw 7 and cylinder head screw 8, respectively, are screwed into the one threaded hole 14 and the other threaded hole 15 serves to fasten front panel 2 with the use of headed screws (not shown) which are pushed through fastening holes 6.

Preferably, the connecting plug 5 is composed of a tough, spring-elastic plastic. This connecting plug 5 has two parallel insertion grooves 16—see FIGS. 3 and 5—for circuit board 1 and a plug-in pin 17 to fasten it in a clamping manner in recess 13 on the rear face 12 of front panel 2. Plug-in pin 17 fits into this recess 13 in such a manner that a press seat is realized.

Figure 3:
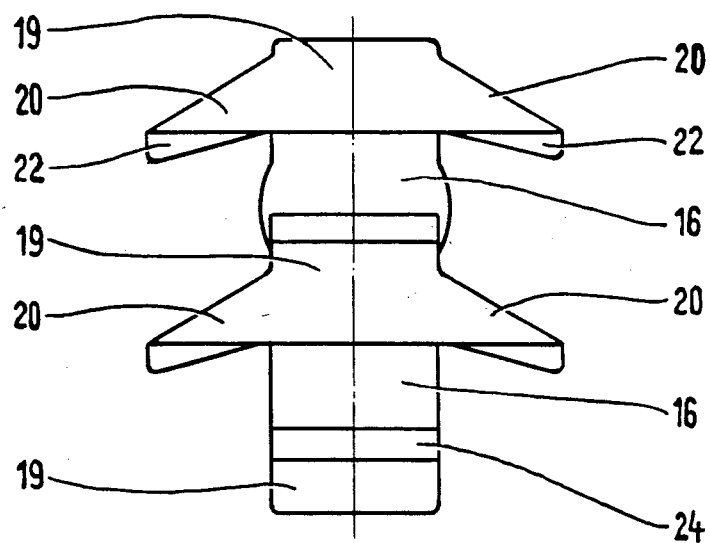
FIG. 3, a top view of the connecting plug of FIG. 2.
Figure 5:
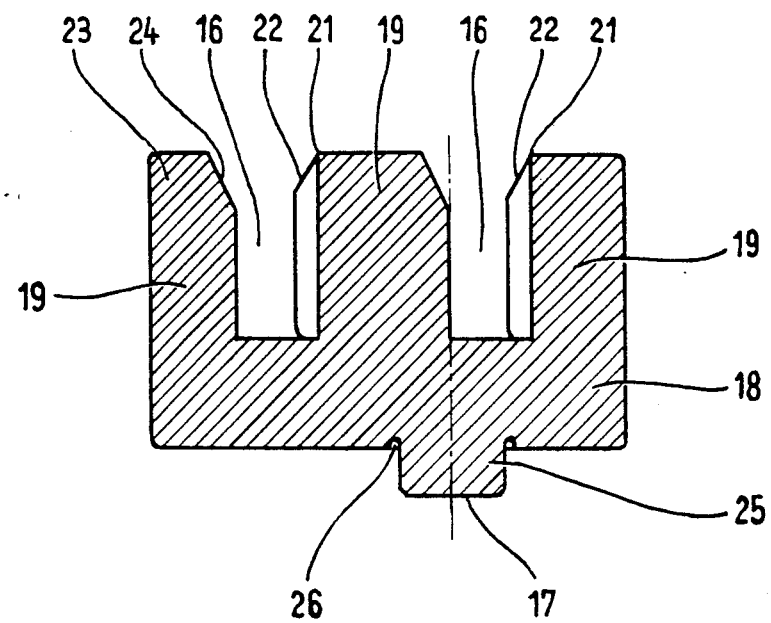
FIG. 5, a longitudinal sectional view, seen along line V—V of FIG. 4, of the connecting plug of FIG. 2.

Insertion grooves 16 are formed by three parallel, juxtaposed flanges 19 formed to the base 18 of connecting plug 5—see FIGS. 3 and 5. At two of these flanges 19, spring arms 20 are formed on at both sides and are provided with slopes 22 on their upper edges 21. Flanges 19 also have insertion slopes 24 at their free ends 23.

Plug-in pin 17 of connecting plug 5 has a circularly cylindrical shape and the recess 13 in rear face 12 of front panel 2 is composed of a blind bore. An annular groove 26 is provided at the base 25 of plug-in pin 17—see FIGS. 4 and 5.

Figure 4:
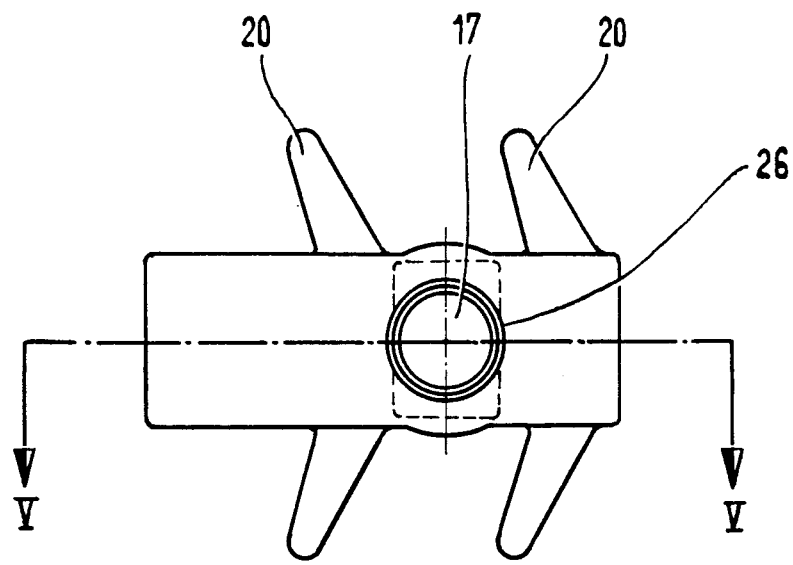
FIG. 4, a bottom view of the connecting plug of FIG. 2.

Plug-in pin 17 may also have the shape of a prism, as this is shown by dashed lines in FIG. 4. In this case, plug-in pin 17 cooperates with a rectangular groove as the recess in front panel 2, which groove extends over a larger, central region of front panel 2.

We claim:

1. A connecting plug for providing lateral support for a circuit board in a plug-in unit intended to receive electrical and electronic components in industrial electronic devices, the plug-in unit including a front panel having a rear face, and a circuit board fastened to the rear face of the front panel and perpendicularly thereto by means of at least two holding blocks, said connecting plug comprising: a body provided on one side with at least one insertion groove for receiving a circuit board; and a plug-in pin projecting from said body at a side opposite said one side, said plug-in being shaped to provide a press seat with a blind recess provided in a rear face of the front panel of the plug-in unit to prevent said connecting plug from dropping off the front panel.

2. A connecting plug according to claim 1, wherein said body includes two parallel, juxtaposed flanges which form a space therebetween comprising said insertion groove.

3. A connecting plug according to claim 2, wherein said flanges each have opposite sides and further comprising a spring arm disposed at either said side of one of said flanges.

4. A connecting plug according to claim 3, wherein said spring arm is shaped to said flange.

5. A connecting plug according to claim 2, wherein said flanges have free ends and the free end of one of said flanges is provided with an insertion slope to facilitate insertion of a circuit board into said insertion groove.

6. A connecting plug according to claim 3, wherein said spring arm has a free edge remote from said one side of said body which is provided with a slope to facilitate insertion of a circuit board into said insertion groove.

7. A connecting plug according to claim 1, wherein said plug-in pin has a circularly cylindrical shape.

8. A connecting plug according to claim 7, wherein said body is provided with an annular groove at the base of said plug-in pin.

9. A connecting plug according to claim 1, wherein said plug-in pin has the shape of a prism.

10. A connecting plug according to claim 7, forming a combination with a plug-in unit comprising a front panel having a rear side, a circuit board, and at least two holding blocks fastening said circuit board perpendicularly to the rear side of said front panel, wherein said front panel is provided with a blind bore as a recess for receiving said plug-in pin.

11. A connecting plug according to claim 9, forming a combination with a plug-in unit comprising a front panel having a rear side, a circuit board, and at least two holding blocks fastening said circuit board perpendicularly to the rear side of said front panel, wherein said front panel is provided with a rectangular groove as a recess for receiving said plug-in pin.

12. A connecting plug according to claim 1, wherein said connecting plug is composed of a spring-elastic plastic.

* * * * *